United States Patent [19]

Schwab

[11] Patent Number: 5,069,831
[45] Date of Patent: Dec. 3, 1991

[54] METHOD FOR SEPARATION OF MICROCAPSULES AND PREPARATION OF PRINTING INKS

[75] Inventor: Gerhart Schwab, Chillicothe, Ohio

[73] Assignee: The Mead Corporation, Dayton, Ohio

[21] Appl. No.: 288,654

[22] Filed: Dec. 22, 1988

[51] Int. Cl.$^5$ .................. B01J 13/20; B41M 3/12
[52] U.S. Cl. .................. 264/4.33; 264/4.3; 264/4.7; 427/213.31; 427/150; 427/151; 430/138
[58] Field of Search .............. 264/4.1, 4.3, 4.33, 264/4.7; 430/138; 427/213.31, 213.34; 503/214

[56] References Cited

U.S. PATENT DOCUMENTS

| | | | |
|---|---|---|---|
| 3,886,084 | 5/1975 | Vassiliades | 264/4.3 |
| 4,356,109 | 10/1982 | Saeki et al. | 264/4.3 |
| 4,406,816 | 9/1983 | Sliwka | 264/4.3 |
| 4,439,488 | 3/1984 | Trimnell et al. | 264/4.3 X |
| 4,450,123 | 5/1984 | Egawa et al. | 264/4.3 X |
| 4,470,935 | 9/1984 | Egawa et al. | 264/4.3 X |
| 4,574,110 | 3/1986 | Asano et al. | 264/4.3 X |
| 4,601,863 | 7/1986 | Shioi et al. | 264/4.3 |
| 4,729,792 | 3/1988 | Seitz | 106/21 |
| 4,745,097 | 5/1988 | Maekawa et al. | 503/209 |
| 4,889,719 | 12/1989 | Ohtsubu et al. | 424/408 |

*Primary Examiner*—Richard D. Lovering
*Assistant Examiner*—John M. Covert
*Attorney, Agent, or Firm*—Thompson, Hine and Flory

[57] ABSTRACT

A method for forming microcapsules which comprises the steps of:
  preparing a slurry of microcapsules containing an ionic or polar emulsifier;
  adding a de-emulsifier to said slurry under such conditions that said de-emulsifier coulombically interacts with said emulsifier and said slurry separates into an aqueous phase and a microcapsule rich phase; and
  separating said microcapsules from said slurry.

15 Claims, No Drawings

METHOD FOR SEPARATION OF MICROCAPSULES AND PREPARATION OF PRINTING INKS

BACKGROUND OF THE INVENTION

The present invention relates to a method for the preparation of oil-containing microcapsules and more particularly to a method for inducing a readily filterable state in the microcapsules such that the microcapsules can be easily removed from the aqueous slurry in which they are prepared and redispersed in an aqueous or oil based printing vehicle to form a coating composition.

A number of microencapsulation techniques have been used to prepare oil-containing microcapsules. Some of the principal techniques are complex coacervation (typically used to prepare gelatin capsules), in situ polymerization (typically used to prepare melamine-formaldehyde and urea-formaldehyde capsules), and interfacial polymerization (typically used to prepare polyurethane and polyurea capsules).

For some applications it is desirable to separate the microcapsules from the dispersion in which they are prepared. One such application is the preparation of coating compositions which are designed to be printed on or spot coated on paper to provide a carbonless form.

A number of techniques have been used to separate microcapsules. One of the principal techniques is spray drying. U.S. Pat. No. 4,139,392 to Davis et al. discloses a hot melt coating composition containing microcapsules in which microcapsules are spray dried to form a free flowing powder which is dispersed in a wax composition with the aid of an anionic dispersing agent.

U.S. Pat. No. 4,171,981 to Austin et al. describes another method for preparing a print on composition containing microcapsules in which an aqueous slurry of microcapsules is mixed with a hot melt suspending medium and a wiped film evaporator is used to remove the water.

U.S. Pat. No. 4,729,792 to Seitz discloses yet another method in which microcapsules are prepared by interfacial crosslinking of a polysalt formed by reaction of a polyamine and a polyanionic emulsifier with a polyisocyanate. The microcapsules are separated by adding a lipophilizing agent to the capsule slurry. The lipophilizing agent reacts with the polyanionic emulsifier and renders it non-polar such that the microcapsules precipitate from the slurry. The microcapsules can then be dispersed in an ink vehicle with the aid of a dispersing agent. It should be noted that dispersing agents are necessary for dispersing in both polar and non-polar printing ink vehicle.

SUMMARY OF THE INVENTION

In accordance with the present invention, an aqueous slurry of microcapsules containing an ionic emulsifier is prepared and the microcapsules are separated from the slurry by adding to the slurry a compound which coulombically interacts with the emulsifier and causes the slurry to separate into an aqueous phase and a microcapsule rich phase. The term "coulombically interact" is used herein to include ionic interaction as well as hydrogen bonding and is to be distinguished from reactions which produce a covalent bond. Hereinafter the compound which coulombically interacts with the emulsifier will be referred to as a "de-emulsifier".

In accordance with the preferred embodiments of the invention, the coulombic reaction of the emulsifier and the de-emulsifier is reversible and, more particularly, it is a pH dependent reaction which can be initiated or reversed by a change in pH such as a change from an alkaline pH to a neutral or acid pH or vice-versa. In one of the preferred embodiments of the invention reversal of de-emulsification is accomplished by mixing the microcapsules with a printing ink vehicle containing a low molecular weight glycol which complexes preferentially with borax to form a liquid complex which is then part of the printing vehicle.

In accordance with one of the preferred embodiments of the invention, the emulsifier is a compound such as gum arabic which contains vicinal cis-hydroxyl groups and the de-emulsifier is a compound such as sodium borate decahydrate (borax), the borate anion of which forms a pH reversible ionic complex with the cis-hydroxyl groups. Under alkaline conditions (pH about 8 to 10) the borate ion complexes with gum arabic to form a gel, in the manner described by Percival, "Structural Carbohydrate Chemistry," J. Garnet Miller, Ltd., London 1962, pages 33–34. The slurry separates and the microcapsules can be removed by filtration centrifugation or other means. This method is particularly advantageous because the filtered microcapsules can be mixed with an ink vehicle containing propylene glycol or other low molecular weight glycols. In the presence of the glycols, the borate de-complexes from the gum arabic and the microcapsules can be readily dispersed in the ink vehicle.

Accordingly, one manifestation of the present invention is a method for preparing microcapsules which comprises the steps of:

preparing a slurry of microcapsules containing an ionic or polar emulsifier, adding a de-emulsifier to said slurry which coulombically interacts with said emulsifier and causes said slurry to separate into an aqueous phase and a microcapsule rich phase, and separating said microcapsules from said slurry.

Another manifestation of the present invention is a method for preparing a coating composition containing microcapsules which comprises:

preparing a slurry of microcapsules containing an ionic or polar emulsifier, adding a de-emulsifier to said slurry which coulombically interacts with said emulsifier and causes said slurry to separate into an aqueous phase and a microcapsule rich phase, separating said microcapsules from said slurry, adding said microcapsules to a coating vehicle, and dispersing said microcapsules in said coating vehicle to form a coating composition.

In accordance with a preferred embodiment of the invention the reaction of the de-emulsifier is reversible, the microcapsules are added to a coating vehicle and the reaction is reversed.

Still more preferably the emulsifier is a compound containing cis-hydroxyl groups, the de-emulsifier is a borate salt and the ink vehicle contains propylene glycol.

DETAILED DESCRIPTION OF THE INVENTION

The method of the present invention can be used in conjunction with known processes for preparing microcapsules, however, it is particularly useful in conjunction with the preparation of polyurea, polyurethane, hydroxyalkylcellulose (e.g., hydroxyethylcellulose or hydroxypropylcellulose), urea-formaldehyde or melamine formaldehyde microcapsules.

The invention relies upon the use of an ionic or polar emulsifier. Ionic or polar emulsifiers stabilize a slurry of microcapsules by imparting an ionic charge or polarity to the microcapsules which prevents the microcapsules from agglomerating and maintains them in dispersed state. In accordance with the present invention, after the microcapsules are formed and it is desired to remove the microcapsules from the slurry, a de-emulsifier is added to the slurry. The de-emulsifier reacts ionically or through the formation of hydrogen bonds with the emulsifier. This alters the ionic character of the emulsifier and destabilizes the slurry such that the slurry separates into an aqueous phase and a microcapsule rich phase.

Emulsifiers useful in the present invention include anionic, cationic, amphoteric and polar emulsifiers. These emulsifiers are typically characterized in that they contain pendant amino, hydroxyl, carboxylic, sulfonic and/or phosphoric acid groups. In accordance with the preferred embodiments of the invention, these compounds contain pendant groups which reversibly interact with the deemulsifying agent in a pH dependent reaction. In accordance with the still more preferred embodiments of the invention, the emulsifiers contain pendant hydroxyl and/or amino groups.

Representative examples of emulsifiers useful in the present invention include polysaccharides, such as pectin, guar gum, other gums, cellulose derivatives, alginates, gum arabic, guar gum, etc.; proteins such as casein; polyvinyl alcohol and the like. The emulsifiers are typically used in an amount of about 1-5% in aqueous solution.

The de-emulsifying agents used in the present invention are compounds which are capable of forming ionic or hydrogen bonds with the emulsifier. Typical examples are salts such as alkali or alkaline earth metal borates and, more particularly, sodium borate and borax, calcium salts such as calcium chloride, aluminum salts such as aluminum sulfate, aluminum nitrate, ferric salts such as ferric chloride.

In addition to the foregoing salts, ionic or polar non-ionic polymers such as polymers conventionally used as flocculating agents in the papermaking industry may be used as de-emulsifiers. In particular, cationic polymers such as poly (diallyl dimethylammonium chloride), cationic polyamines, cationic polyacrylamides, etc. may be used. Representative polymers include homopolymers, and copolymers of such monomers as quaternary diallyl diallylammonium chlorides such as diallyl dimethylammonium chloride N-alkylammonium chloride, methacrylamidopropyl trimethylammonium chloride, methacryloxyethyl trimethylammonium chloride, vinylbenzyl trimethylammonium chloride, etc. Commercially available cationic polymers include Warcofix 808 from Sun Chemical Company, Calgon 261 LV and Calgon 7091 RV from Calgon Corporation, Nalco 8674 from Nalco Corporation, Cat Floc C from Calgon Corporation. Particularly useful are Percol 406, a poly(diallyl dimethylammonium chloride) having a molecular weight of $1.5 \times 10^6$ and a 50% charge density; Percol 1401, a cationic polyamine having a molecular weight of about 500,000 and a charge density of 50%; and Percol 181, a polyacrylamide having a molecular weight of $9 \times 10^6$ and a charge density of 30%, all available from Allied Colloids Inc. Non-ionic polymers such as poly (alkylene oxides) can also be used through hydrogen bonding with the emulsifier.

Microcapsules prepared using emulsifiers such as pectin, sodium alginate and gum arabic can be coagulated by crosslinking with divalent and trivalent metal ions such as calcium (II) and aluminum (III) ions available from calcium salts such as calcium chloride and aluminum salts such as aluminum sulfate and aluminum nitrate.

In a preferred embodiment of the invention, the ability of borates to form pH dependent ionic complexes with vicinal cis-glycols is used to separate the microcapsule slurry (hereafter "the cis-hydroxyl borate system"). This reaction is pH dependent and can be represented as follows:

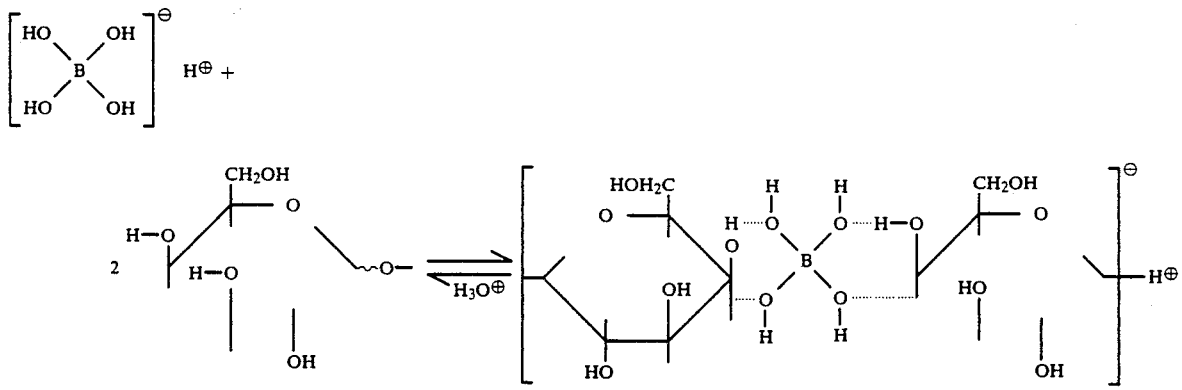

At alkaline pH, the microcapsule slurry can be thickened through the addition of the borate. The hydrated borate anions form hydrogen bonds with the cis-hydroxy groups of the emulsifier. Thickening of the slurry can be induced through the addition of a base. After separation, the microcapsules can be re-dispersed in a coating vehicle with the pH adjusted to acid or neutral. With the pH adjusted to neutral or acid, crosslinking reverses and the capsules readily are dispersible in the ink vehicle. It is particularly preferred to add the microcapsules to an ink vehicle containing propylene glycol as described below.

If redispersion of microcapsules separated through the interaction of an emulsifier and metal salts is difficult, chelating agents such as EDTA. (ethylene diamine tetracetic acid), citric acid, tetrasodium polyphosphate may be added to the printing vehicle. The chelating agent preferentially interacts with the metal ion to free the emulsifier thereby rendering the microcapsules redispersible.

The microcapsules can be formulated into a printing ink using commercially available printing ink vehicles. The microcapsules may be incorporated into the print vehicle to provide an ink suitable for wet or dry offset by merely substituting the microcapsule filtercake for the pigment of the ink and using a wetting agent if necessary.

Representative examples of useful ink vehicles include waxes and mineral oils such as paraffins, isoparaffins, and aromatic hydrocarbons having a boiling point greater than 180° C. Waxes such as carnauba wax, microcrystalline wax, and mixtures thereof examples of which are described in U.S. Patent 4, 139,392 to Davis, phenolic resins, alkyd resins, modified alkyd resins, etc., vegetable waxes, mineral waxes and/or synthetic waxes may be used.

The solids content of the printing ink may range from about 15 to 70% and preferably 30 to 60% percent.

Other useful waxes are described in U.S. Pat. No. 4,640,847 and include montan wax and polyethylene wax. The wax compositions described in U.S. Pat. No. 4,371,634 may also be used.

In addition to the binder material, the ink vehicle may contain other additives conventionally used in printing ink compositions including but not limited to biocides, pigments, stilt materials such as starch granules or cellulose fiber particles, anti-skinning agents may also be used as well as printing oils, printing pastes, and the like siccatives or drying accelerators such as organic acid salts in a conventional manner.

It is particularly desirable to add the microcapsules to a glycol based ink vehicle because any water retained in the microcapsule filtercake is miscible with the ink vehicle and the borate complex releases the capsules while the borate complexes with the low molecular weight glycol (to form a liquid complex). A representative example of a glycol based vehicle is propylene glycol. Other vehicles which may be used include latexes such as Dow Latex 30711 which is a carboxylated styrene-butadiene latex. A preferred latex is another carboxylated styrene-butadiene latex, Polysar Latex 1164, available from BASF. This latex is especially suitable in combination with the propylene glycol in that it gives low viscosity, high solids mixtures. To facilitate dispersion of the microcapsules in the latexes, a dispersant such as sodium polyacrylate (Dispex 40 available from Allied Colloids, Inc. Suffolk, Va.) may be used. Another useful acrylic vehicle is Versacryl, which is commercially available from Johnson Wax.

The present invention is illustrated in more detail by the following non-limiting example.

EXAMPLE 1

Preparation of Polyurea Microcapsules Using Pectin as Emulsifier

| Solution A | |
| --- | --- |
| Sure-Sol 290 (alkyl biphenyl mixture from Koch Chemical Co., Corpus Christi, TX.) | 23,308 g |
| Sure-Sol 210 (alkylaromatic hydrocarbon from Koch Chemical Co., Corpus Christi, TX.) | 15,539 g |
| Pergascript blue I-2G (blue color former) | 3,410 g |

| -continued | |
| --- | --- |
| PAPI 27 (mixture of diphenylmethane diisocyanate and polymethylene polyphenyl isocyanate from Dow Chemical Co.) | 906 g |
| Desmodur N-100 (aliphatic polyisocyanate from Mobay Chemical Corp.) | 2,848 g |
| Solution B | |
| Pectin (Sigma Chemical) | 863 g |
| Water | 47,480 g |

Solution A was emulsified into solution B over a period of 5 minutes. Total emulsification time was 32 minutes at 7650 rpm. Final mean capsule diameter was 5.4 microns. After emulsification was completed the emulsion was pumped into the reactor and the following solution C was added slowly.

| Solution C | |
| --- | --- |
| CMC 7 L1T (sodium carboxymethylcellulose, low molecular weight D.S. = 0.7, Technical grade from Hercules, Inc., Wilmington, DE.) | 252 g |
| Diethylenetriamine | 1,043 g |
| Water | 4,316 g |

HCl @ 38% till pH 4.35 where the amine is present as a hydrochloric acid salt.

The pH was then adjusted to 10 with a 50% solution of sodium hydroxide and the batch was cured for 3 hours at 60°–65° C.

EXAMPLE 2

To 100g of the polyurea microcapsules slurry (41–42% solids) prepared in Example 1 was added five drops of 1% aqueous solution of calcium chloride dihydrate. The slurry thickened immediately. It was suction filtered to a filtercake containing 70% solids. This filtercake (40 g) was redispersed in Dow Latex 30711 (20 g) this mixture was somewhat grainy. Five drops of a 1% solution of citric acid was added to the mixture followed by one drop of a 50% aqueous solution of sodium hydroxide. This smoothed out the composition. The composition was coated on a base stock and dried to provide a carbonless recording sheet which imaged very well against a conventional developer sheet.

EXAMPLE 3

To 100g of microcapsules prepared as in Example 1 was added 0.4g of poly (diallyl dimethylammonium chloride) having a molecular weight of approximately $1.5 \times 10^6$ and a 50% charge density. This mixture was stirred and warmed slightly for 15 to 20 minutes whereafter it was suction filtered for 15 minutes to produce a filtercake containing 68% solids.

EXAMPLE 4

To 100 g of the polyurea capsule slurry prepared in Example 1 was added 0.4 g Percol 401 (a polyamine having a molecular weight of 500,000 and a 50% charge density commercially available from Allied Colloids, Inc.) This mixture was filtered 20 minutes to provide a filtercake.

EXAMPLE 5

To 100 g of the polyurea capsule slurry prepared in Example 1 was added 0.4 g Percol 181 (a poly (acrylamide) having a molecular weight of $9 \times 10^6$ and a 30% charge density). The slurry was filtered 1.5 hours to provide a filtercake.

EXAMPLE 6

To 100g of the polyurea capsule slurry prepared in Example 1 was added 0.4g Polyox N-12K (a poly (ethylene oxide) having a molecular weight of approximately $1 \times 10^6$ commercially available from Union Carbide Corp.). Approximately two hours was required to provide a filtercake.

EXAMPLE 7

Preparation of Polyurea Microcapsules

Solutions A and B were prepared as follows.

| Solution A | |
|---|---|
| Sure-Sol 290 | 22,356 g |
| Sure-Sol X-210 | 14,904 g |
| Crystal Violet Lactone | 3,622 g |
| PX1 SF-50 (toluene diisocyanate based adduct from Polyblends, Inc., Livonia, MI.) | 1,043 g |
| Desmodur N-100 | 3,273 g |
| Solution B | |
| Gum Arabic | 2,312 g |
| Water | 11.65 gal. |

Solution B has a pH of 5.

Solution A is emulsified into B over a period of 6 minutes. Emulsification is continued another 24 minutes for a total of 30 minutes, in line rpm 7,650. After emulsification is complete, the emulsion is pumped to reactor and the following Solution C is added.

| Solution C | |
|---|---|
| CMC 7 L1T | 241.5 g |
| Diethylenetriamine | 1,200.6 g |
| Water | 12,075.0 g |

HCl till pH 4.35 where the amine is blocked as a hydrochloride salt.

The pH is adjusted to 10 with a 50% solution of sodium hydroxide and the batch was cured at 60°-65° C. for three hours.

EXAMPLE 8

Polyurea microcapsules prepared as in Example 7 were diluted to 43.2% solids with distilled water and the pH was adjusted to 9 using 10% aqueous sodium hydroxide. To 100 g of the microcapsule slurry was added 0.5 g sodium borate decahydrate (borax) under stirring. The dispersion thickened considerably and became somewhat lumpy. It was suction filtered in ten minutes to from a filtercake having 75% solids. This filtercake (40 g) was mixed with 20 g Dow Latex 3071 (carboxylated styrene-butadiene latex available from Dow Chemical Co.) A few drops of HCl solution were added to adjust the pH to neutral. A smooth, relatively fluid composition was obtained having a solids content of 68.4%. A drawdown of this material was prepared using a hand proofer gravure offset roll combination (100 lines/inch) to give a recording sheet which imaged well on a conventional developer sheet.

EXAMPLE 9

To 100 g capsule slurry as prepared in Example 7 there was added 20 g of a 2.5% borax solution. The thickened, slightly lumpy dispersion was suction filtered to a filtercake of 65% solids. This filtercake (36.4 g) was mixed with 6.83 g Polysar 1164 latex, 17.08 g propylene glycol and 0.034 g Dispex N40 dispersant (salt of a polymeric acid in aqueous solution). The final mixture was low in viscosity, smooth and had 71.2% non aqueous components. A drawdown of this material was prepared using a hand proofer gravure offset roll combination (100 lines/inch) to give a recording sheet which imaged well on a conventional developer sheet.

Printing inks prepared in accordance with the present invention are particularly useful because they contain a high amount of microcapsules, e.g. 55 to 70% other negotiable instruments in place of carbon based compositions to eliminate the black "carbon" bars which interfere with efficient check processing.

Having described the invention in detail and by reference to preferred embodiments thereof, ti will be apparent that modifications and variations are possible without departing from the scope of the invention defined in the appended claims.

What is claimed is:

1. A method for preparing a coating composition containing microcapsules which comprises the steps of:
preparing a slurry of microcapsules containing an ionic or poly emulsifier wherein said emulsifier is characterized in that said emulsifier contains pendant amino, hydroxyl, carboxylic acid, sulfonic acid, or phosphonic acid groups;
after preparing said slurry of microcapsules, adding a de-emulsifier to said slurry wherein said de-emulsifier is a metal salt, a cationic polymer, an anionic polymer, or a non-ionic polymer whereupon said de-emulsifier coulombically interacts with said emulsifier causing said slurry to separate into an aqueous phase and a microcapsule rich phase;
separating said microcapsules from said slurry; and dispersing said microcapsules in a coating vehicle.

2. The method of claim 1 wherein the interaction of said de-emulsifier with said emulsifier is reversible.

3. The method of claim 2 wherein said interaction of said emulsifier is reversible at alkaline or acid pH.

4. The method of claim 3 wherein said emulsifier is pectin and said de-emulsifier is calcium chloride.

5. The method of claim 1 wherein said emulsifier is selected from the group consisting of polysaccharides, gum arabic, and proteins.

6. The method of claim 1 wherein said de-emulsifier is selected from the group consisting sodium, aluminum, calcium, and ferric salts.

7. The method of claim 6 wherein said de-emulsifier is a borate and said emulsifier contains vicinal cis-hydroxy groups.

8. The method of claim 7 wherein said borate is sodium borax and said emulsifier is gum arabic.

9. The method of claim 1 wherein said de-emulsifier reacts with said emulsifier by forming hydrogen or ionic bonds with said emulsifier.

10. The method of claim 1 wherein said de-emulsifier is a cationic polymer selected from the group consisting of poly(diallyl dimethylammonium chloride), polyamine, polyacrylamides, and poly(alkylene oxide).

11. The method of claim 1 wherein said microcapsules are prepared by interfacial polymerization of a polyisocyanate and a polyol or a polyamine.

12. The method of claim 11 wherein said microcapsules are prepared by forming an oil in water emulsion, said oil phase containing said polyisocyanate and said water phase containing said polyamine.

13. The method of claim 1 wherein said coating vehicle contains a glycol.

14. The method of claim 1 wherein said emulsifier is an alginate or a cellulose derivative.

15. The method of claim 1 wherein said microcapsules are polyurea, polyurethane, hydroxyethyl cellulose, hydroxypropyl cellulose, urea formaldehyde or melamine formaldehyde microcapsules.

* * * * *